(12) United States Patent
Zhong et al.

(10) Patent No.: US 7,695,890 B2
(45) Date of Patent: Apr. 13, 2010

(54) NEGATIVE PHOTORESIST FOR SILICON KOH ETCH WITHOUT SILICON NITRIDE

(75) Inventors: Xing-Fu Zhong, Rolla, MO (US); Jyoti K. Malhotra, Rolla, MO (US); Chenghong Li, Morrisville, NC (US)

(73) Assignee: Brewer Science Inc., Rolla, MO (US)

( * ) Notice: Subject to any disclaimer, the term of this patent is extended or adjusted under 35 U.S.C. 154(b) by 204 days.

(21) Appl. No.: 11/470,520

(22) Filed: Sep. 6, 2006

(65) Prior Publication Data

US 2007/0075309 A1    Apr. 5, 2007

Related U.S. Application Data

(60) Provisional application No. 60/715,964, filed on Sep. 9, 2005.

(51) Int. Cl.
G03F 7/00 (2006.01)
G03F 7/004 (2006.01)

(52) U.S. Cl. .............. 430/270.1; 430/907; 430/914

(58) Field of Classification Search .......... 430/270.1, 430/907, 914
See application file for complete search history.

(56) References Cited

U.S. PATENT DOCUMENTS

| | | | |
|---|---|---|---|
| 3,398,044 A | 8/1968 | Plueddemann | |
| 3,461,027 A | 8/1969 | Plueddemann | |
| 3,468,834 A | 9/1969 | Oda et al. | |
| 3,585,103 A | 6/1971 | Thomson | |
| 3,826,709 A | 7/1974 | Humphries | |
| 4,800,125 A | 1/1989 | Plueddemann | |
| 4,826,564 A | 5/1989 | Desilets et al. | |
| 5,077,174 A * | 12/1991 | Bauer et al. | 430/270.1 |
| 5,100,503 A * | 3/1992 | Allman et al. | 438/694 |
| 5,217,568 A | 6/1993 | Tessier et al. | |
| 5,353,705 A | 10/1994 | Lewis et al. | |
| 5,585,450 A | 12/1996 | Oaks et al. | |
| 5,753,523 A | 5/1998 | Giedd et al. | |
| 5,874,365 A | 2/1999 | Tomita et al. | |
| 5,922,410 A | 7/1999 | Swartz et al. | |
| 6,162,860 A * | 12/2000 | Anderson et al. | 524/507 |
| 6,358,665 B1 | 3/2002 | Pawlowski et al. | |
| 6,773,862 B2 * | 8/2004 | Shirakawa et al. | 430/270.1 |
| 6,773,867 B2 * | 8/2004 | Nozaki et al. | 430/313 |
| 6,878,502 B2 | 4/2005 | Mizutani et al. | |
| 6,956,268 B2 | 10/2005 | Faris | |
| 7,049,164 B2 | 5/2006 | Bruner | |
| 7,316,844 B2 * | 1/2008 | Li et al. | 428/421 |
| 2002/0051928 A1 | 5/2002 | Zampini et al. | |
| 2002/0058749 A1 | 5/2002 | Larson et al. | |
| 2002/0185199 A1 | 12/2002 | Myers et al. | |
| 2003/0216508 A1 * | 11/2003 | Lee | 525/67 |
| 2005/0037281 A1 | 2/2005 | Sato et al. | |
| 2005/0158538 A1 | 7/2005 | Li et al. | |
| 2006/0070441 A1 | 4/2006 | Durante et al. | |
| 2006/0166393 A1 | 7/2006 | Ha et al. | |
| 2006/0166403 A1 | 7/2006 | Ouellet et al. | |

FOREIGN PATENT DOCUMENTS

| | | |
|---|---|---|
| EP | 0 539 973 | 5/1993 |
| JP | 2004-264623 | 9/2004 |
| JP | 2005-008847 | 1/2005 |
| WO | WO 02/087340 | 11/2002 |
| WO | WO 2005/052688 | 6/2005 |
| WO | WO 2006/046687 | 5/2006 |
| WO | WO 2007/030593 | 3/2007 |

OTHER PUBLICATIONS

Brar, A.S., and Pradhan, D.R., "Investigation of Microstructure of the Acrylonitrile-Styrene-Glycidyl Methacrylate Terpolymers by 1D and 2D NMR Spectroscopy," Journal of Applied Polymer Science, vol. 89, 1779-1790 (2003), 2003 Wiley Periodicals, Inc.

Ciba Specialty Chemicals Inc., Photoacid Generators for Microlithography, Jan. 2003, printed in Switzerland.

Bishop, David, Heuer Arthur, and Williams, David, "Microelectromechanical Systems: Technology and Applications," MRS Bulletin, Apr. 2001, pp. 282-288.

Bodas, Dhananjay et al., "PMMA as an etch mask for silicon micromachining—a feasibility study," *J. Indian Inst. Sci.*, vol. 81, Dec. 2001, pp. 645-651.

Elders, Job et al., "Microsystems Technology (MST) and MEMS Applications: An Overview," MRS Bulletin, Apr. 2001, pp. 312-315.

(Continued)

*Primary Examiner*—Amanda C. Walke
(74) *Attorney, Agent, or Firm*—Hovey Williams LLP

(57) ABSTRACT

New photoresists for use during the production of semiconductor and MEMS devices are provided. The primer layer preferably comprises a silane dissolved or dispersed in a solvent system. The photoresist layer includes copolymers prepared from styrene, acrylonitrile, and epoxy-containing monomers. The photoresist layer comprises a photoacid generator, and is preferably negative-acting.

36 Claims, No Drawings

OTHER PUBLICATIONS

Goldman, Ken et al., "Evaluating the use of hard-mask films during bulk silicon etching," MICRO Magazine, Mar. 1997, p. 67, http://www.mIcromagazine.com/archive/97/03/goldman.html, 7 pages.

Kovacs, Gregory T.A. et al., "Bulk Micromachining of Silicon," Proceedings of the IEEE, vol. 86, No. 8, Aug. 1998, pp. 1536-1551.

Maluf, Nadim, An Introduction to Microelectromechanical Systems Engineering, Norwood, MA: Artech House, Inc., 2000, pp. 54-63.

Robbins, Harry and Schwartz, Bertram, "Chemical Etching of Silicon: I. The System HF, $HNO_3$, and $H_2O$," Journal of the Electrochemical Society, vol. 106, No. 6, Jun. 1959, pp. 505-508.

Robbins, H. and Schwartz, B., "Chemical Etching of Silicon: II. The System HF, $HNO_3$, $H_2O$, and $HC_2H_3O_2$," Journal of the Electrochemical Societh, vol. 107, No. 2, Feb. 1960, pp. 108-111.

Yoon, Tae Hwan et al., "A Micromachined Silicon Depth Probe for Multichannel Neural Recording," IEEE Transactions on Biomedical Engineering, vol. 47, No. 8, Aug. 2000, pp. 1082-1087.

Black C. T. et al, "Integration of Self-Assembled Diblock Copolymers for Semiconductor Capacitor Fabrication," Applied Physics Letters, vol. 79, No. 3, Jul. 16, 2001, 2001 American Institute of Physics, pp. 409-411.

Office Action in U.S. Appl. No. 11/736,429 dated Jun. 27, 2008, 13 pages.

Translation of JP 2004-264623 published Sep. 24, 2004, 30 pages, www19.ipdl.inpit.go.jp.

Translation of WO 2006/046687 published May 4, 2006, 21 pages.

* cited by examiner

NEGATIVE PHOTORESIST FOR SILICON KOH ETCH WITHOUT SILICON NITRIDE

RELATED APPLICATIONS

This applications claims the priority benefit of U.S. Patent Application No. 60/715,964, filed Sep. 9, 2005, entitled NEGATIVE PHOTORESIST FOR SILICON KOH ETCH WITHOUT SILICON NITRIDE, incorporated by reference herein.

BACKGROUND OF THE INVENTION

1. Field of the Invention

The present invention is concerned with new photoresists for use in the manufacture of microelectronic devices such as those used in microelectromechanical systems (MEMS).

2. Description of the Prior Art

It is common in silicon etching processes to utilize a thin (100- to 300-nm) silicon nitride or silicon dioxide coating on the silicon substrate as a mask for patterned etching or as a passivating layer to enclose active circuitry. In the prior art, etch protective coatings or masks for MEMS fabrication processes have been selected primarily by using a trial-and-error method because there are no general purpose protective coatings on the market. The etch selectivity of the etchants to various materials is often used as a guide for MEMS process engineers. With a much lower etch rate than silicon, films of silicon nitride have been used as a protective layer or hardmask during KOH or TMAH bulk silicon etching. Silicon dioxide has a higher etch rate than silicon nitride, Therefore, it is only used as a protective/mask layer for very short etches. Gold (Au), chromium (Cr), and boron (B) have also been reportedly used in some situations. Non-patterned, hard-baked photoresists have been used as masks, but they are readily etched in alkaline solutions. Polymethyl methacrylate was also evaluated as an etch mask for KOH. However, because of saponification of the ester group, the masking time of this polymer was found to decrease sharply from 165 minutes at 60° C. to 15 minutes at 90° C.

Regardless of the protective coating or mask selected, a photoresist layer to be patterned must be applied to the protective coating or mask so that the pattern can be transferred to the underlying substrate. However, this can only be carried out after the protective coating or mask has been applied, thus requiring time and expense to apply and later etch this protective layer or mask, which is very difficult to remove.

SUMMARY OF THE INVENTION

The present invention overcomes these problems by providing spin-applied, photosensitive coating systems that replace prior art masks or protective coatings, and that eliminate the need for additional photoresists in the system. The inventive systems protect device features from corrosion and other forms of attack during deep-etching processes that utilize concentrated aqueous bases.

The invention provides a photosensitive composition useful as a protective layer. The composition comprises a polymer and a photoacid generator, and the polymer comprises styrene-containing monomers, acrylonitrile-containing monomers, and epoxy-containing monomers. The invention also provides methods of using these photosensitive compositions in conjunction with a primer layer to form microelectronic structures.

DETAILED DESCRIPTION OF THE PREFERRED EMBODIMENTS

In more detail, these systems comprise a primer layer that is applied to a microelectronic substrate surface, and a photosensitive layer that is applied to the primer layer.

Primer Layer

Preferred primer layers are formed from primer layer compositions including a silane dispersed or dissolved in a solvent system. Aromatic and organo silanes are particularly preferred silanes for use in the primer layers of the invention. Furthermore, it is preferred that the silane include at least one (and more preferably 2-3) group per mole of compound, or per repeat unit of polymer, that reacts with epoxy groups to form covalent bonds so that adhesion to a silicon substrate is very strong. One preferred such group is an amine group.

Preferred silanes include aminoalkoxysilanes, preferably from about $C_1$ to about $C_8$ alkoxys, more preferably from about $C_1$ to about $C_4$ alkoxys, and even more preferably from about $C_1$ to about $C_3$ alkoxys. Even more preferably, the aminoalkoxysilane is an aminoalkylalkoxysilane, preferably from about $C_1$ to about $C_8$ alkyls, more preferably from about $C_1$ to about $C_4$ alkyls, and even more preferably from about $C_1$ to about $C_3$ alkyls. Phenylaminoalkylalkoxysilanes are also preferred. Some examples of the foregoing include aminopropyltrimethoxysilane, aminiopropyltriethoxysilane, N-phenylaminopropyltrimethoxysilane, N-phenylaminopropyltriethoxysilane, 3-glycidoxpropyltrimethoxysilane, 2-(3, 4-epoxycyclohexyl)ethyltrimethoxysilane, and 3-mercaptopropyl-trimethoxysilane.

Other preferred silanes include phenylsilanes such as phenyltrimethoxysilane, phenyltrichlorosilane, phenyltriethoxysilane, phenyltriacetoxysilane, and diphenylsilanes such as diphenyldimethoxysilane, diphenyldichlorosilane, and diphenylsilanediol. The most preferred silanes include 2-phenylethyltrialkoxysilane p/m-chlorophenyltrimethoxysilane, p/m-bromophenyltrimethoxysilane, (pim-chloromethyl)phenyltrimethoxysilanie 2-(p/m-methoxy)phenylethyltrimethoxysilane, 2-(p/m-chloromethyl)phenylethyltrimethoxysilane, 3,4-dichlorophenyltnichlorosilane, 3-phenoxypropyltrichlorosilane, 3-(N-phenylamino)propyltnimethoxysilane, and 2-(diphenylphosphino)ethyltriethoxysilane.

Some preferred silanes for use in the present invention can also be represented by the general formula

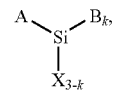

where:

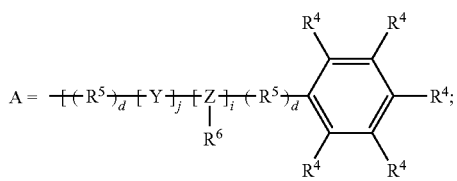

-continued

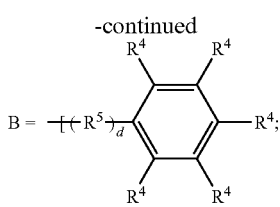

wherein:
- each of i, j, and k is individually selected from the group consisting of 0 and 1, and if one of i and j is 1, then the other of i and j is 0;
- each $R^4$ is individually selected from the group consisting of hydrogen, the halogens, $C_1$-$C_8$ (preferably $C_1$-$C_4$) alkyls, $C_1$-(C (preferably $C_1$-$C_4$) alkoxys, $C_1$-$C_8$ (preferably $C_1$-$C_4$) haloalkyls, aminos, and $C_1$-$C_8$ (preferably $C_1$-$C_4$) alkylaminos;
- each $R^5$ is individually selected from the group consisting of $C_1$-$C_8$ (preferably $C_1$-$C_4$) aliphatic groups;
- each $R^6$ is individually selected from the group consisting of hydrogen and haloalkyls (preferably $C_1$-C8, more preferably $C_1$-$C_4$);
- each X is individually selected from the group consisting of halogens, hydroxyls, $C_1$-$C_4$ alkoxys and $C_1$-$C_4$ carboxyls;
- Y is selected from the group consisting of oxygen and sulfur;
- Z is selected from the group consisting of nitrogen and phosphorus; and
- each d is individually selected from the group consisting of 0 and 1.

An effective primer layer composition according to the invention is a mixture of a diphenyidialkoxysilane (e.g., diphenyldimethoxysilane) and a phenyltrialkoxysilane, (e.g., phenyltrimethoxysilane) or, even more preferably, a mixture of diphenylsilanediol and phenyltrimethoxysilane in a solution of 1-methoxy-2-propanol or 1-propoxy-2-propanol with from about 5-10% by weight water. A particularly effective primer layer composition for photosensitive layers comprising a poly(styrene-co-acrylonitrile) polymer is an alcohol and water solution containing from about 0.1-1.0% (preferably from about 0.25-0.5%) by weight diphenylsilanediol and from about 0.1-1.0% (preferably from about 0.25-0.5%) by weight of phenyltrimethoxysilane. Upon heating, diphenylsilanediol and phenylsilanetriol (the hydrolysis product of phenyltrimethoxysilane) condense to from siloxane bonds and establish a three-dimensional silicone coating layer on the substrate.

Another preferred silane has the formula

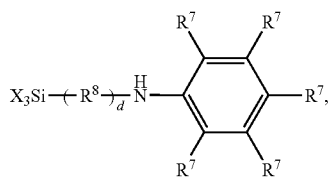

wherein:
- each $R^7$ is individually selected from the group consisting of hydrogen, the halogens, $C_1$-$C_8$ (preferably $C_1$-$C_4$) alkyls, $C_1$-C, (preferably $C_1$-$C_4$) alkoxys, $C_1$-C, (preferably $C_1$-$C_4$) haloalkyls, aminos, and $C_1$-$C_8$ (preferably $C_1$-$C_4$) alkylaminos; and
- each $R^8$ is individually selected from the group consisting of $C_1$-$C_8$ (preferably $C_1$-$C_4$) aliphatic groups.

Silanes having this structure are not only compatible with styrene-containing copolymers, but they are also reactive with ester, benzyl chloride, and/or epoxy groups, and they are excellent adhesion promoters. One particularly preferred silane within the scope of this formula is

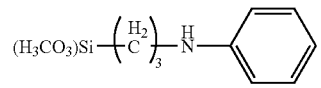

This silane is 3-[N-phenylamino]propyltrimetlioxysilane (mentioned above), and it is commercially available from Lancaster Synthesis and Gelest Corporation.

The silane should be included in the primer layer composition at a level of from about 0.1% to about 3% by weight, preferably from about 0.2% to about 2% by weight, and even more preferably from about 0.5% to about 1% by weight, based upon the total weight of solids in the primer layer composition taken as 100% by weight The solvent system utilized in the primer layer composition should have a boiling point of from about 100° C. to about 220° C., and preferably from about 140° C. to about 180° C. The solvent system should be utilized at a level of from about 30% to about 99.9% by weight, and preferably from about 40% to about 80% by weight, based upon the total weight of the primer layer composition taken as 100% by weight. Preferred solvent systems include a solvent selected from the group consisting of methanol, ethanol, isopropanol, butanol, 1-methoxy-2-propanol, ethylene glycol monomethyl ether, and 1-propoxy-2-propanol, and mixtures thereof. In one preferred embodiment, water is included in the solvent system at a level of from about 20% to about 60% by weight, and preferably from about 20% to about 40% by weight, based upon the total weight of the primer layer composition taken as 100% by weight.

The primer layer composition can also include a catalyst. Suitable catalysts include any inorganic or organic acid (e.g., hydrochloric acid, sulfuric acid, phosphoric acid, acetic acid) or an inorganic or organic base (e.g., potassium hydroxide, TMAH, ammonia, amines). The catalyst is preferably present in the primer layer composition at levels of from about 0.01% to about 0.5% by weight, more preferably from about 0.1% to about 0.3% by weight, and even more preferably from about 0.02% to about 0.03% by weight, based upon the total weight of solids in the primer layer composition taken as 100% by weight.

Finally, the primer layer can also include a number of optional ingredients, such as a surfactant. In one embodiment, from about 100 ppm to about 150 ppm of a surfactant such as FC4430 (available from 3M) or Triton X-100 (available from 3M) can be added to make a uniform primer coating that is defect-free.

The Photosensitive Layer

The photosensitive layer is formed from a composition comprising a polymer dispersed or dissolved in a solvent system. A preferred polymer is a terpolymer comprising recurring: styrene monomers; acrylonitrile monomers; and monomers comprising functional groups that react with amines.

Preferred styrene monomers have the formula

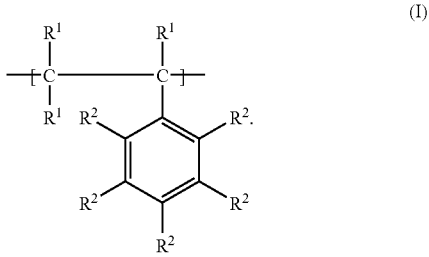

Preferred acrylonitrile monomers have the formula

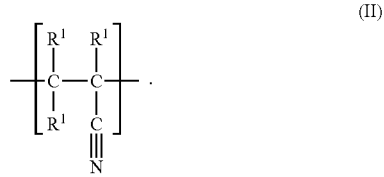

Preferred monomers comprising functional groups for reacting with amines include monomers comprising one or more epoxy groups (e.g., glycidyl methacrylate, glycidyl acrylate, vinylbenzoyl glycidyl ether). One example is represented by the formula

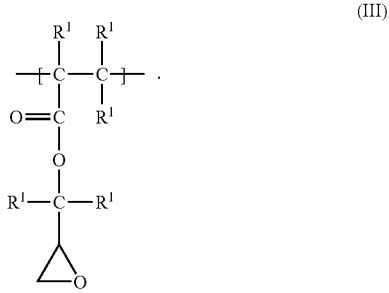

In each of the above formulas (I)-(III):
each $R^1$ is individually selected from the group consisting of hydrogen and $C_1$-$C_8$ (and preferably $C_1$-$C_4$) alkyls; and
each $R^2$ is individually selected from the group consisting of hydrogen, $C_1$-$C_8$ (and preferably $C_1$-$C_4$) alkyls, and $C_1$-$C_8$ (and preferably $C_1$-$C_4$) alkoxys.

The polymer preferably comprises from about 35% to about 75% by weight of monomer (I), more preferably from about 40% to about 70% by weight of monomer (I), and even more preferably from about 50% to about 65% by weight of monomer (I). The polymer preferably comprises from about 20% to about 40% by weight of monomer (II), more preferably from about 25% to about 35% by weight of monomer (II), and even more preferably from about 25% to about 30% by weight of monomer (II). Finally, the polymer preferably comprises from about 5% to about 15% by weight of monomer (III), more preferably from about 6% to about 12% by weight of monomer (III), and even more preferably from about 8% to about 10% by weight of monomer (III). Each of the above percentages by weight is based upon the total weight of the polymer taken as 100% by weight.

It is preferred that the polymer have a weight average molecular weight of from about 10,000 Daltons to about 80,000 Daltons, preferably from about 20,000 Daltons to about 60,000 Daltons, and even more preferably from about 30,000 Daltons to about 50,000 Daltons.

Monomers other than monomers (I), (II), and (III) can also be present in the polymer, if desired. When other monomers are present, the combined weight of monomers (I), (II), and (III) in the polymer is preferably at least about 60% by weight, and more preferably from about 70% to about 90% by weight, based upon the total weight of the polymer taken as 100% by weight. Examples of suitable other monomers include those having functional groups that can react with groups in the primer layer for achieving chemical bonding between the two layers. These monomers may have, by way of example, haloalkyl (e.g., benzyl chloride, 2-chloroethyl methacrylate), ester (methacrylates, acrylates, maleates, fumarates, isocyanates), or anhydride functional groups, which react readily with functional groups such as hydroxyl, amino, or oxiranyl groups that can be present in the primer layer.

The polymer should be included in the photosensitive layer composition at a level of from about 90% to about 98% by weight, and preferably from about 90% to about 95% by weight, based upon the total weight of solids in the photosensitive layer composition taken as 100% by weight.

The photosensitive composition will also comprise a photoacid generator (PAG). The PAG generates a strong acid or superacid when exposed to actinic radiation such as UV light. Examples of suitable PAGs include those selected from the group consisting of triarylsulfonium hexafluoroantimonate, triarylulfonium hexafluorophosphate, diaryliodonium hexafluoroantimonate, diaryliodonium hexafluorophosphate,

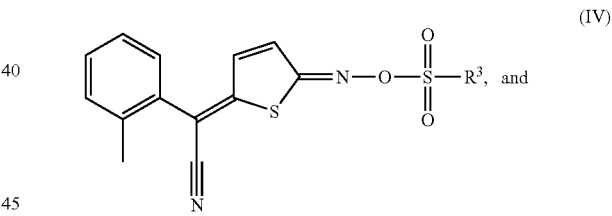

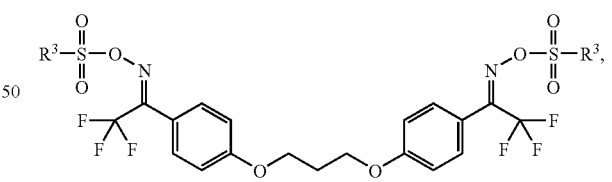

where each $R^3$ is individually selected from the group consisting of $C_3H_7$, $C_8H_{17}$, $CH_3C_6H_4$, and camphor. The PAGs of formulas (IV) and (V) are sold by Ciba Specialty Chemicals as The CGI 13XX Family and The CGI 26X Family, respectively.

The PAG should be included in the photosensitive composition at a level of from about 2% to about 10% by weight, and preferably from about 5% to about 8% by weight, based upon the total weight of solids in the photosensitive composition taken as 100% by weight.

The solvent system utilized in the photosensitive composition should have a boiling point of from about 120° C. to about 200° C., and preferably from about 130° C. to about 180° C. The solvent system should be utilized at a level of from about 70% to about 95% by weight, and preferably from about 80% to about 90% by weight, based upon the total weight of the photosensitive composition taken as 100% by weight. Preferred solvent systems include a solvent selected from the group consisting of methyl isoamyl ketone, di(ethylene glycol) dimethyl ether, propylene glycol monomethyl ether acetate, ethyl lactate, cyclohexanone, and mixtures thereof.

Application Process

Preferred substrates for use in this process include those comprising silicon. Some particularly preferred substrates are selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

The silane and any other components are dissolved in the primer solvent system to form the silane composition. This composition is then spin-applied onto the substrate at about 500-5,000 rpm, and preferably from about 1000-3,000 rpm, for about 30-90 seconds, and preferably for about 60 seconds. It is then baked at a temperature of from about 60-110° C. for about 60-180 seconds (preferably about 120 seconds), and then at about 150-250° C. for about 60-180 seconds (preferably about 120 seconds) in order to condense the silane molecules into a continuous film that is bonded to surface hydroxyl groups present on typical microelectronic substrates. That is, the hydrolyzed silane reacts with the silanol groups present in the silicon-containing substrate and also self-crosslinks by condensation. It is preferred that the primer layer have an average thickness (as measured by an ellipsometer over 5 different points) of less than about 50 nm and more preferably from about 20 nm to about 30 nm.

For the photosensitive layer, the polymer, PAG, and any other components are dissolved in the solvent system and spin coated onto the substrate at about 1,000-5,000 rpm, and preferably from about 1,000-2,000 rpm, for about 30-90 seconds, and preferably about 60 seconds. It is then baked at a temperature of from about 100-120° C. for about 60-180 seconds (preferably about 120 seconds). The polymer solids level and spinning conditions are typically adjusted to achieve an average coating thickness after baking (as measured by an ellipsometer over 5 different points) of from about 500 nm to about 3,000 nm, and preferably from about 1,000 nm to about 2,000 nm, depending upon the degree of coverage required over device topography on the substrate. Advantageously, the epoxy or other reactive group in the photosensitive layer polymer form covalent bonds with an amine or other reactive group on the silane of the primer layer.

The photosensitive layer is then imaged by exposing it to UV light with a wavelength of from about 150-500 nm (e.g., about 248 nm or about 365 nm), preferably in a dose of about 500 mJ/cm². The coating is then preferably post-exposure baked at about 110° C. to about 30° C. for about 2 minutes, and developed with a solvent for about 1 minute. Finally, the coating is baked at about 200° C. to about 250° C. for about 5 minutes.

Exposure to light causes the PAG to generate an acid, and this acid initiates crosslinking of the polymer (preferably via the epoxy groups) in the photosensitive layer. The crosslinked epoxy groups will have the structure

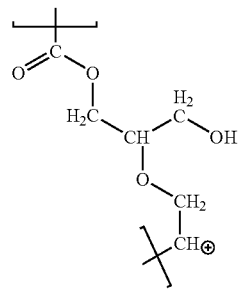

The exposed areas become substantially insoluble (e.g., less than about 1% by weight soluble, preferably less than about 0.05% soluble, and more preferably about 0% soluble) in typical solvent developers such as propylene glycol monomethyl ether acetate, methyl isoamyl ketone, and ethyl acetoacetate. The unexposed areas remain soluble in these developers and are thus readily removed during developing. As a result, the pattern can be easily transferred with no additional etching steps to remove the protective layer being needed.

Practicing the present invention will result in a protective layer system that suffers little or no undercutting during etching processes. That is, the layer systems will exhibit less than about 100 μm, preferably less than about 70 μm, and more preferably less than about 50 μm of undercutting when subjected for about 2 hours (or even about 3 hours) to etching in an approximately 30-35% by weight aqueous KOH solution having a temperature of about 83-87° C. Undercutting is determined by measuring the width of overhanging protective layer at the edge of etched areas as observed under a confocal microscope. 5 Furthermore, the inventive protective systems will experience very little or no etchant penetration during etching processes. Thus, when subjected for about 2 hours (or even about 3 hours) to etching in an approximately 30-35% by weight aqueous KOH solution having a temperature of about 83-87 ° C., the inventive protective systems will have less than about 0.1 pinholes per cm² of substrate, and preferably less than about 0.05 pinholes per cm² of substrate, when observed under a microscope at 10× magnification. This is different from prior art photosensitive layers, which would dissolve relatively quickly in KOH and thus required the presence of a separate protective layer such as a silicon nitride layer.

EXAMPLES

The following examples set forth preferred methods in accordance with the invention. It is to be understood, however, that these examples are provided by way of illustration and nothing therein should be taken as a limitation upon the overall scope of the invention.

Example 1

1. Terpolymer Synthesis in Cyclopentanone

A solution was made by dissolving 67.50 g of styrene, 25.00 g of acrylonitrile, 7.50 g of glycidyl methacrylate, and 1.25 g of 2,2'-azobisisobutyronitrile in 400 g of cyclopentanone, all of which were obtained from Aldrich. The solution was heated to 65° C. under nitrogen while undergoing magnetic stirring. The polymerization was allowed to proceed at 65° C. for 98 hours. The actual yield was determined by solids analysis to be 97% of the theoretical yield.

2. Topcoat Solution Formulation

In this preparation procedure, 25.01 g of propylene glycol methyl ether acetate (PGMEA, General Chemical) and 1.03 g of UVI-6976 (a triarylsulfonium hexafluoroantimonate; a photoacid generator obtained from Dow Chemical) were added to 50.03 g of the terpolymer solution synthesized in Part 1 of this Example. The resulting solution was filtered through a 0.1-μm membrane filter.

3. Primer Solution Formulation

To make a primer solution, 1.02 g of N-phenylaminopropyltrimethoxysilane (obtained from Gelest) were dissolved in a mixture of 120.4 g of propylene glycol propyl ether (obtained from General Chemical) and 80.2 g of deionized water. The solution was filtered through a 0.1-μm membrane filter.

4. Preparation and Patterning of Negative Photoresist Coating

The primer solution in Part 3 of this Example was spin coated onto a silicon wafer at 1,500 rpm for 1 minute. The primer coating was baked at 75° C. for 2 minutes and then at 180° C. for 2 minutes. The topcoat solution of Part 2 of this Example was then spin coated over the primer layer at 1,500 rpm for 1 minute. The topcoat was baked at 100° C. for 2 minutes. The coating was imaged by exposing it to UV light at 2)0 a wavelength of 365 nm in a dose of 500 mJ/cm², baking at 130° C. for 2 minutes, and developing with acetone for 1 minute. Finally, the combination was baked at 230° C. for 5 minutes. A negative pattern was obtained.

5. Etching of Silicon Wafer

The wafer prepared and patterned in Part 4 of this Example was etched in 30% KOH aqueous solution at 85° C. for 1 hour. The silicon was etched 70 μm deep in areas without the polymer coating. The polymer-coated areas remained intact. The pattern was transferred to the silicon wafer in essentially the same manner as is the case with prior art silicon nitride masking methods.

Example 2

1. Terpolymer Synthesis in PGMEA

A solution was made by dissolving 27.07 g of styrene, 10.00 g of acrylonitrile, 3.08 g of glycidyl methacrylate, and 0.51 g of dicumyl peroxide (obtained from Aldrich) in 160 g of PGMEA. The solution was heated to 120° C. under nitrogen while undergoing magnetic stirring. The polymerization was allowed to proceed at 120° C. for 24 hours. The actual yield was determined by solids analysis to be 95.5% of the theoretical yield.

2. Topcoat Solution Formulation

In this preparation procedure, 4.54 g of PGMEA and 0.114 g of UVI-6976 were added to 5.03 g of the terpolymer solution synthesized in Part 1 of this Example. The solution was filtered through a 0.1 μm membrane filter.

3. Preparation and Patterning of Negative Photoresist Coating

The primer solution of Part 2 of Example 1 was spin coated onto a silicon wafer at 1,500 rpm for 1 minute. The primer coating was baked at 60° C. for 5 minutes and at 180° C. for 2 minutes. The topcoat solution from Part 2 of this Example was then spin coated onto the wafer at 1,500 rpm for 1 minute. The topcoat was baked at 100° C. for 2 minutes. After the coating was imaged by exposing it to UV light at 254 nm in a dose of 500 mJ/cm², it was baked at 130° C. for 2 minutes and then developed with PGMEA for 1 minute. The coating was finally baked at 230 ° C. for 5 minutes. A negative pattern was obtained.

4. Etching of Silicon Wafer

The wafer prepared and patterned in Part 3 of this Example was etched in 30% KOH aqueous solution at 80° C. for 1 hour. The silicon was etched 58 μm deep in the areas without the polymer coating. The polymer-coated areas remained intact. The pattern was transferred to the silicon wafer in essentially the same way as with prior art silicon nitride masking methods.

Example 3

1. Terpolymer Synthesis in PGMEA

A solution was made by dissolving 168.0 g of styrene, 84.0 g of acrylonitrile, 28.3 g of glycidyl methacrylate, and 7.0 g of dicumyl peroxide in 1,120 g of PGMEA. The solution was heated to 120° C. under nitrogen while undergoing magnetic stirring. The polymerization was allowed to proceed at 120° C. for 28 hours. The actual yield was found by solid analysis to be 97.5% of the theoretical. The terpolymer was precipitated in isopropanol, filtered, and dried overnight under vacuum at 50° C.

2. Topcoat Solution Formulation

In this preparation procedure, 32.8 g of the terpolymer synthesized in Part 1 of this Example were dissolved in 140.0 g of PGMEA and 40.0 g of ethyl acetylacetate. Next, 6.0 g of UVI-6976 were added, and the solution was filtered through a 0.1-μm membrane filter.

3. Primer Solution Formulation

To prepare a primer solution, 2,04 g of N-phenylaminopropyltrimethoxysilane were dissolved in a mixture of 77.50 g of propylene glycol propyl ether (PnP), 120.14 g of deionized water, 0.51 g of acetic acid, and 0.03 g of FC4430 (a surfactant). The solution was stirred magnetically for more than 2 hours. It was filtered through a 0.1-μm membrane filter.

4. Preparation and Patterning of Negative Photoresist Coating

The primer solution prepared in Part 3 of this Example was spin coated onto a silicon wafer at 1,500 rpm for 1 minute. The primer coating was baked at 100° C. for 1 minute and then at 205 ° C. for 1 minute. The topcoat solution from Part 2 of this Example was spin coated over the primer layer at 1,500 rpm for I minute. The topcoat was baked at 110° C. for 2 minutes. The coating was imaged by exposing it to UV light at a wavelength of 365 nm in a dose of 500 mJ/cm², baking at 130 ° C. for 2 minutes, and developing with PGMEA for 1 minute. Finally, the combination was baked at 230° C. for 5 minutes. A negative pattern was obtained.

5. Etching of Silicon Wafer

The wafer prepared and patterned in Part 4 of this Example was etched in 30% KOH aqueous solution at 75° C. for 4 hours. The silicon was etched 178 μm deep in the areas without the polymer coating. The polymer-coated area remained intact. The pattern was transferred to the silicon wafer in essentially the same manner as prior art silicon nitride masking methods.

What is claimed is:

1. A photosensitive composition useful as a protective layer, said composition being alkaline-resistant and negative-acting and said composition comprising a polymer and a photoacid generator dissolved or dispersed in a solvent system, said polymer comprising:

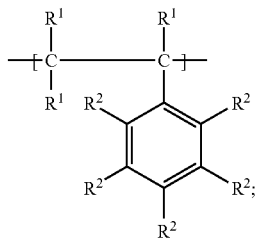

(I)

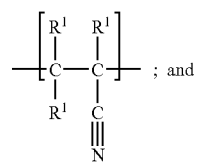

(II)

(III) a monomer comprising at least one epoxy group, wherein in (I) and (II):
  each $R^1$ is individually selected from the group consisting of hydrogen and $C_1$-$C_8$ alkyls; and
  each $R^2$ is individually selected from the group consisting of hydrogen, and $C_1$-$C_8$ alkyls, wherein said first polymer comprises from about 35% to about 75% by weight of (I) and from about 20% to about 40% by weight of (II).

2. The composition of claim 1, wherein said monomer (III) is selected from the group consisting of glycidyl methacrylate, glycidyl acrylate, and vinylbenzyl glycidyl ether monomers.

3. The composition of claim 1, wherein said monomer (III) has the formula

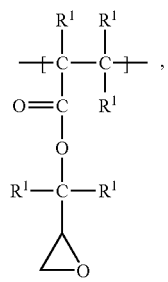

wherein each $R^1$ is individually selected from the group consisting of hydrogen and $C_1$-$C_8$ alkyls.

4. The composition of claim 1, wherein said photoacid generator is selected from the group consisting of triarylsulfonium hexafluoroantimonate, triarylsulfonium hexafluorophosphate, diaryliodonium hexafluoroantimonate, diaryliodonium hexafluorophosphate,

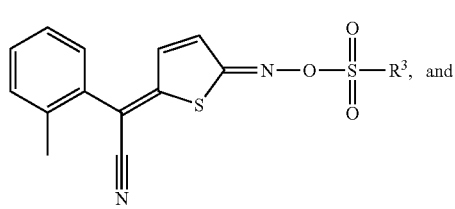

(IV)

-continued

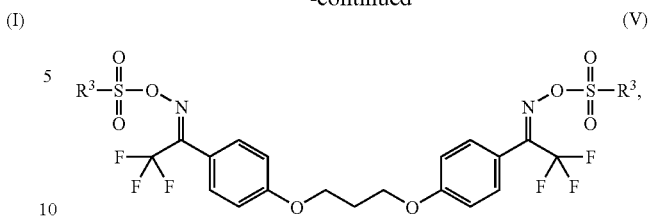

(V)

wherein each $R^3$ is individually selected from the group consisting of $C_3H_7$, $C_8H_{17}$, $CH_3C_6H_4$, and camphor.

5. The composition of claim 1, wherein said polymer comprises from about 35% to about 75% by weight of (I), from about 20% to about 40% by weight of (II), and from about 5% to about 15% by weight of (III), based upon the total weight of the polymer taken as 100% by weight.

6. A method of forming a microelectronic structure, said method comprising:
  providing a microelectronic substrate;
  applying a primer layer to said substrate, said primer layer comprising a silane dispersed or dissolved in a solvent system;
  applying a photosensitive layer to said primer layer, said photosensitive layer comprising a photoacid generator and a polymer dispersed or dissolved in a solvent system, said
  polymer comprising:

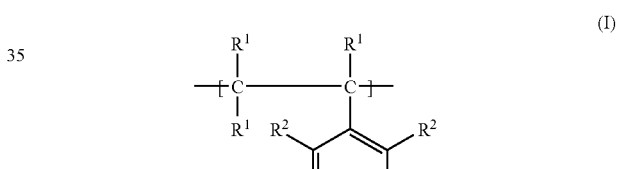

(I)

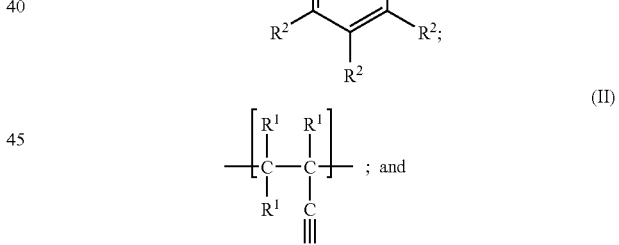

(II)

(III) a monomer comprising at least one epoxy group, wherein in (I) and (II):
  each $R^1$ is individually selected from the group consisting of hydrogen and $C_1$-$C_8$ alkyls; and
  each $R^2$ is individually selected from the group consisting of hydrogen, and $C_1$-$C_8$ alkyls; and
  etching said stack with KOH so as to transfer the pattern of said photosensitive layer to said substrate, wherein said photosensitive layer exhibits less than about 0.1 pinholes per $cm^2$ of substrate.

7. The method of claim 6, wherein said monomer (III) is selected from the group consisting of glycidyl methacrylate, glycidyl acrylate, and vinylbenzyl glycidyl ether monomers.

8. The method of claim 6, wherein said monomer (III) has the formula

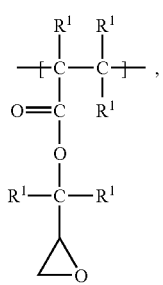

wherein each $R^1$ is individually selected from the group consisting of hydrogen and $C_1$-$C_8$ alkyls.

9. The method of claim 6, wherein said photoacid generator is selected from the group consisting of triarylsulfonium hexafluoroantimonate, triarylsulfonium hexafluorophosphate, diaryliodonium hexafluoroantimonate, diaryliodonium hexafluorophosphate,

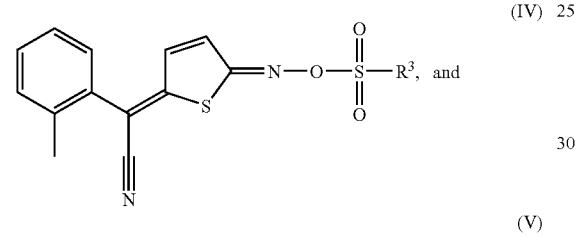

(IV)

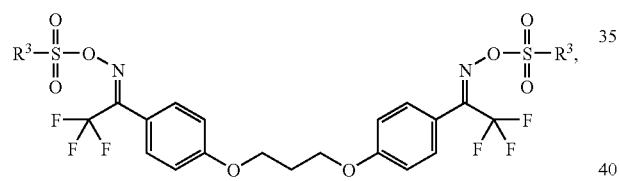

(V)

wherein each $R^3$ is individually selected from the group consisting of $C_3H_7$, $C_8H_{17}$, $CH_3C_6H_4$, and camphor.

10. The method of claim 6, wherein said polymer comprises from about 35% to about 75% by weight of (I), from about 20% to about 40% by weight of (II), and from about 5% to about 15% by weight of (III), based upon the total weight of the polymer taken as 100% by weight.

11. The method of claim 6, wherein said silane having a formula selected from the group consisting of

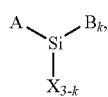

(VI)

where:

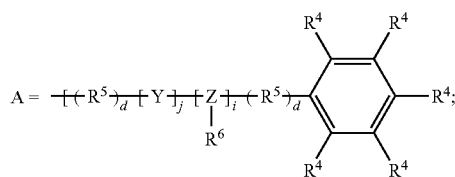

-continued

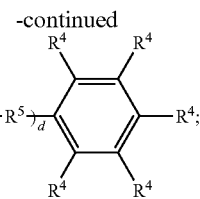

wherein:
each of i, j, and k is individually selected from the group consisting of 0 and 1, and if one of i and j is 1, then the other of i and j is 0;
each $R^4$ is individually selected from the group consisting of hydrogen, the halogens, $C_1$-$C_8$ alkyls, $C_1$-$C_8$ alkoxys, $C_1$-$C_8$ haloalkyls, aminos, and $C_1$-$C_8$ alkylaminos;
each $R^5$ is individually selected from the group consisting of $C_1$-$C_8$ aliphatic groups;
each $R^6$ is individually selected from the group consisting of hydrogen and haloalkyls;
each X is individually selected from the group consisting of halogens, hydroxyls, $C_1$-$C_4$ alkoxys and $C_1$-$C_4$ carboxyls;
Y is selected from the group consisting of oxygen and sulfur;
Z is selected from the group consisting of nitrogen and phosphorus; and each d is individually selected from the group consisting of 0 and 1; and

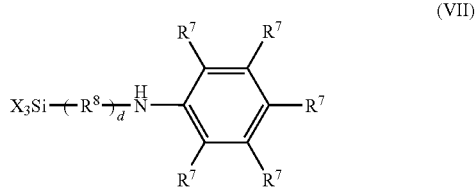

(VII)

wherein:
each $R^7$ is individually selected from the group consisting of hydrogen, the halogens, $C_1$-$C_8$ alkyls, $C_1$-$C_8$ alkoxys, $C_1$-$C_8$ haloalkyls, aminos, and $C_1$-$C_8$ alkylaminos; and
each $R^8$ is individually selected from the group consisting of $C_1$-$C_8$ aliphatic groups.

12. The method of claim 6, said silane being selected from the group consisting of aminoalkoxysilanes, phenylsilanes, and diphenylsilanes.

13. The method of claim 12, wherein said silane is selected from the group consisting of aminoalkylalkoxysilanes and phenylaminoalkylalkoxysilanes.

14. The method of claim 12, wherein said silane is selected from the group consisting of aminopropyltrimethoxysilane, aminopropyltriethoxysilane, N-phenylaminopropyltrimethoxysilane, N-phenylaminopropyltriethoxysilane, 3-glycidoxypropyltrimethoxysilane, 2-(3,4-epoxycyclohexyl)ethyltrimethoxysilane, 3-mercaptopropyl-trimethoxysilane, phenyltrimethoxysilane, phenyltrichiorosilane, phenyriethoxysilane, phenyltriacetoxysilane, diphenyldimethoxysilane, diphenyldichiorosilane, diphenylsilanediol 2-phenylethyltrialkoxysilane, p/m-chlorophenyltrimethoxysilane, p/m-bromophenyltrimethoxysilane,(p/m-chloromethyl)phenyltrimethoxysilane, 2-(p/m-methoxy)phenylethyltrimethoxysilane, 2-(p/m-chloromethyl)phenylethyltrimethoxysilane, 3,4-dichlorophenyltrichlorosilane, 3-phenoxypropyltrichlorosilane, 3-(N-phenylamino)propyl-trimethoxysilane, and 2-(diphenylphosphino)ethyltriethoxysilane.

15. The method of claim 6, further comprising baking said primer layer after said primer layer applying.

16. The method of claim 15, wherein said primer layer further comprises a catalyst, and said primer layer baking results in crosslinking of said silane.

17. The method of claim 6, further comprising baking said photosensitive layer after said photosensitive layer applying.

18. The method of claim 17, wherein said baking causes the polymer of said photosensitive layer to covalently bond with the silane of said primer layer.

19. The method of claim 6, further comprising exposing a first portion of said photosensitive layer to actinic radiation while a second portion of said photosensitive layer is not exposed to actinic radiation.

20. The method of claim 19, wherein said first portion of said photosensitive layer crosslinks during said exposing.

21. The method of claim 20, further comprising baking said photosensitive layer after said exposing to actinic radiation.

22. The method of claim 20, further comprising developing said photosensitive layer.

23. The method of claim 22, wherein said developing results in the second portion of said photosensitive layer being substantially removed during said developing step so as to form a stack including a photosensitive layer having a pattern formed therein.

24. The method of claim 23, further comprising baking said photosensitive layer after said developing.

25. The method of claim 6, wherein said photosensitive layer exhibits less than about 100 μm of undercutting during etching.

26. The method of claim 6, wherein said substrate is selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semi conductor substrates, and metal substrates.

27. A microelectronic structure comprising:
a microelectronic substrate;
a primer layer adjacent said substrate, said primer layer comprising a crosslinked silane; a photosensitive layer adjacent said primer layer, said photosensitive layer being alkaline-resistant and comprising a polymer comprising:

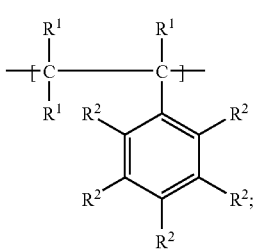
(I)

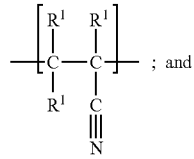
(II)

(III) a monomer comprising at least one crosslinked epoxy group,
wherein in (I) and (II):
each $R^1$ is individually selected from the group consisting of hydrogen and $C_1$-$C_8$ alkyls; and
each $R^2$ is individually selected from the group consisting of hydrogen, and $C_1$-$C_8$ alkyls, wherein said first polymer comprises from about 35% to about 75% by weight of (I) and from about 20% to about 40% by weight of (II).

28. The microelectronic structure of claim 27, wherein said crosslinked epoxy group comprises

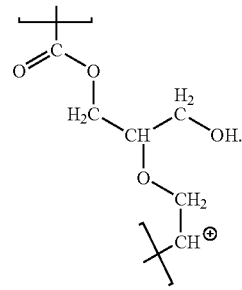

29. The microelectronic structure of claim 27, wherein said silane comprises an amine, and the polymer of said photosensitive layer comprises an epoxy group covalently bonded with said amine.

30. The microelectronic structure of claim 27, wherein said polymer comprises from about 35% to about 75% by weight of (I), from about 20% to about 40% by weight of (II), and from about 5% to about 15% by weight of (III), based upon the total weight of the polymer taken as 100% by weight.

31. The microelectronic structure of claim 27, said silane having a formula selected from the group consisting of

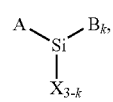
(VI)

where:

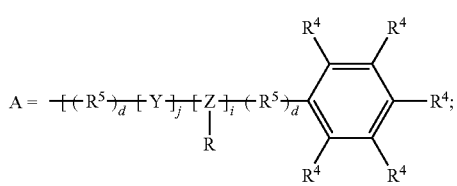

-continued

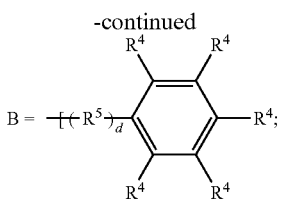

wherein:
  each of i, j, and k is individually selected from the group consisting of 0 and 1, and if one of i and j is 1, then the other of i and j is 0;
  each $R^4$ is individually selected from the group consisting of hydrogen, to halogens, $C_1$-$C_8$ alkyls, $C_1$-$C_8$ alkoxys, $C_1$-$C_8$ haloalkyls, aminos, and $C_1$-$C_8$ alkylaminos;
  each $R^5$ is individually selected from to group consisting of $C_1$-$C_8$ aliphatic groups;
  each $R^6$ is individually selected from to group consisting of hydrogen and haloalkyls;
  each X is individually selected from the group consisting of halogens, hydroxyls, $C_1$-$C_4$ alkoxys and $C_1$-$C_4$ carboxyls;
  Y is selected from the group consisting of oxygen and sulfur;
  Z is selected from the group consisting of nitrogen and phosphorus; and
  each d is individually selected from the group consisting of 0 and 1; and

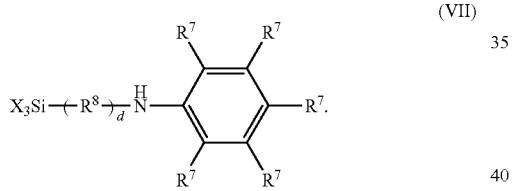

wherein:
  each $R^7$ is individually selected from the group consisting of hydrogen, the halogens, $C_1$-$C_8$ alkyls, $C_1$-$C_8$ alkoxys, $C_1$-$C_8$, haloalkyls, aminos, and $C_1$-$C_8$ alkylaminos; and
  each $R^8$ is individually selected from the group consisting of $C_1$-$C_8$ aliphatic groups.

32. The microelectronic structure of claim 27, said silane being selected from the group consisting of aminoalkoxysilanes, phenylsilanes, and diphenylsilanes.

33. The microelectronic structure of claim 32, wherein said silane is selected from the group consisting of aminoalkylalkoxysilane and phenylaminoalkylalkoxysilanes.

34. The microelectronic structure of claim 32, wherein said silane is selected from the group consisting of aminopropyltrimethoxysilane, aminopropyltriethoxysilane, N-phenylaminopropyltrimethoxysilane, N-phenylaminopropyltriethoxysilane, 3-glycidoxypropyltrimethoxysilane, 2-(3,4-epoxycyclohexyl)ethyltrimethoxysilane, 3-mercaptopropyltrimethoxysilane, phenyltrimethoxysilane, phenyltrichiorosilane, phenyltriethoxysilane, phenyltriacetoxysilane, diphenyldimethoxysilane, diphenyldichiorosilane, diphenylsilanediol 2-phenylethyltrialkoxysilane, p/m-chlorophenyltrimethoxysilane, p/m-bromophenyltrimethoxysilane,(p/m-chloromethyl) phenyltrimethoxysilane, 2-(p/m-methoxy)phenyl ethyltrimethoxysilane, 2-(p/m-chloromethyl)phenylethyltrimethoxysilane, 3,4-dichlorophenyltrichlorosilane, 3-phenoxypropyltrichiorosilane, 3-(N-phenylamino)propyltrimethoxysilane, and 2-(diphenylphosphino) ethyltriethoxysilane.

35. The microelectronic structure of claim 27, wherein said substrate is selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

36. A method of forming a microelectronic structure, said method comprising:
  providing a microelectronic substrate selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates;
  applying a primer layer to said substrate, said primer layer comprising a silane dispersed or dissolved in a solvent system;
  applying a photosensitive layer to said primer layer, said photosensitive layer comprising a photoacid generator and a polymer dispersed or dissolved in a solvent system, said polymer comprising:

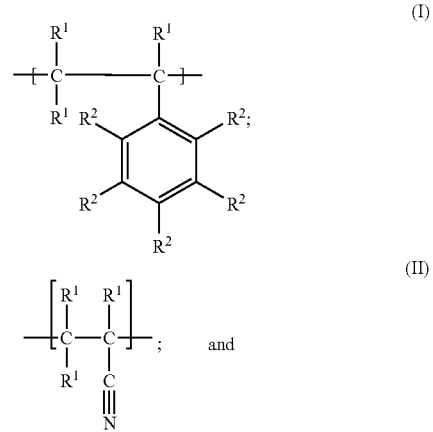

(III) a monomer comprising at least one epoxy group,
  wherein in (I) and (II):
    each $R^1$ is individually selected from the group consisting of hydrogen and $C_1$-$C_8$ alkyls; and
    each $R^2$ is individually selected from the group consisting of hydrogen, and $C_1$-$C_8$ alkyls.

* * * * *

UNITED STATES PATENT AND TRADEMARK OFFICE
CERTIFICATE OF CORRECTION

PATENT NO. : 7,695,890 B2  Page 1 of 1
APPLICATION NO. : 11/470520
DATED : April 13, 2010
INVENTOR(S) : Zhong et al.

It is certified that error appears in the above-identified patent and that said Letters Patent is hereby corrected as shown below:

Column 7, line 60, the text including the range reading "about 110° C. to about 30°C." should read:
-- about 110° C. to about 130°C. --

Column 8, line 35, the text beginning the sentence reading "5 Furthermore," should read:
-- Furthermore, --

Signed and Sealed this

Sixth Day of July, 2010

David J. Kappos
*Director of the United States Patent and Trademark Office*